United States Patent
Wu et al.

(10) Patent No.: US 6,569,729 B1
(45) Date of Patent: May 27, 2003

(54) METHOD OF FABRICATING THREE DIMENSIONAL CMOSFET DEVICES FOR AN EMBEDDED DRAM APPLICATION

(75) Inventors: Chung-Cheng Wu, Hsin-Chu (TW); Shye-Lin Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/199,854

(22) Filed: Jul. 19, 2002

(51) Int. Cl.⁷ ................................................ H01L 21/761
(52) U.S. Cl. ........................................ 438/219; 438/405
(58) Field of Search ................................. 438/219, 405, 438/FOR 217, FOR 222

(56) References Cited

U.S. PATENT DOCUMENTS

| | | | |
|---|---|---|---|
| 4,754,314 A | | 6/1988 | Scott et al. ............. 357/42 |
| 5,338,965 A | * | 8/1994 | Malhi |
| 5,604,137 A | | 2/1997 | Yamazaki et al. ........ 437/40 |
| 5,773,326 A | | 6/1998 | Gilbert et al. |
| 5,795,809 A | * | 8/1998 | Gardner et al. |
| 5,847,419 A | * | 12/1998 | Imai et al. |
| 5,877,048 A | * | 3/1999 | Wu |
| 5,943,562 A | * | 8/1999 | Gardner et al. |
| 6,121,662 A | * | 9/2000 | Wu |
| 6,214,653 B1 | | 4/2001 | Chen et al. ............. 438/153 |
| 6,214,694 B1 | | 4/2001 | Leobandung et al. ...... 438/413 |
| 6,232,170 B1 | | 5/2001 | Hakey et al. ............. 438/243 |
| 6,331,456 B1 | * | 12/2001 | Wu |
| 6,352,882 B1 | * | 3/2002 | Assaderaghi et al. |

* cited by examiner

Primary Examiner—George Fourson
Assistant Examiner—Joannie Adelle Garcia
(74) Attorney, Agent, or Firm—George O. Saile; Stephen B. Ackerman

(57) ABSTRACT

A method of reducing the aspect ratio for dry etch processes used to form contact hole and storage node openings in composite insulator layers, to expose regions of CMOS devices used for embedded memory cell applications, has been developed. The method features formation of CMOS devices for an embedded memory cell in a recessed region of a semiconductor substrate, while peripheral, higher performing CMOS devices are formed on a non-recessed, SOI layer. Removal of a top portion of a first planarized insulator layer, only in the embedded memory cell region, allows reduction of the aspect ratio of a storage node opening formed in the bottom portion of the first planarized insulator layer. Formation of an overlying, second planarized insulator layer results in a composite insulator layer comprised of a thinned, second planarized insulator layer on the underlying first planarized insulator layer, in the peripheral CMOS device region. The thinned, second planarized insulator component of the composite insulator layer allows reduction of the aspect ratio for formation of a contact hole now defined in the composite insulator layer.

12 Claims, 6 Drawing Sheets

METHOD OF FABRICATING THREE
DIMENSIONAL CMOSFET DEVICES FOR
AN EMBEDDED DRAM APPLICATION

BACKGROUND OF THE INVENTION

1. Field of the Invention

The present invention relates to methods used to fabricate semiconductor devices and more specifically to a process sequence allowing fabrication of both high performance complimentary metal oxide semiconductor field effect transistor (CMOSFET) devices, and embedded dynamic random access memory E-DRAM devices, to be realized on the same semiconductor chip.

2. Description of Prior Art

In an effort to improve performance of specific CMOS devices used in the periphery of memory cells, fabrication of these devices have been accomplished in thin silicon layers residing on insulator. The use of a thin silicon layer on insulator, referred to as silicon on insulator (SOI), allows reductions of performance degrading capacitance to be realized thus reducing device delay time for the CMOS peripheral devices. Other type CMOS devices used for memory cells benefit via formation directly on a semiconductor substrate, or on a non-SOI region. Thus semiconductor chips are now being fabricated wherein CMOS logic type devices are formed on SOI regions on a semiconductor substrate, while CMOS memory type devices used for either E-DRAM, embedded static random access memory (E-SRAM), or embedded flash memory cells are formed on non-SOI regions of the same semiconductor substrate. The formation of SOI regions however can result in the peripheral devices being located on higher topographical surfaces of the semiconductor substrate, while the embedded memory devices are formed in recess regions of the same semiconductor substrate. This anomaly, the difference in height between the peripheral CMOS devices, and the embedded CMOS devices, can result in high aspect ratios for the definition procedure used to form openings in composite insulator layers used with both type devices.

This invention will describe a process sequence for fabrication of peripheral devices located on SOI regions, and for embedded devices located on recessed regions of a semiconductor substrate, featuring a reduction of the contact hole aspect ratio of the peripheral CMOS device, as well as a reduction of the aspect ratio of a capacitor plug opening in a recessed, embedded CMOS device. Prior art such as: Wu, in U.S. Pat. No. 6,121,662; Scott et al, in U.S. Pat. No. 4,754,314; Chen et al, in U.S. Pat. No. 6,214,653 B1; Leobanduag et al, in U.S. Pat. No. 6,214,694 B1; Hakey et al, in U.S. Pat. No. 6,232,170 B1; and Yamazaki et al, in U.S. Pat. No. 5,604,137, all describe methods of forming devices on both SOI and non-SOI regions. However none of these prior arts describe the key features supplied in this present invention allowing the aspect ratio of specific hole openings for devices formed on both SOI and directly on recessed portions of a semiconductor substrate, to be reduced.

SUMMARY OF THE INVENTION

It is an object of this invention to fabricate high performance CMOS devices on a SOI region of a semiconductor substrate, used for peripheral circuitry, while fabricating additional CMOS devices on recessed regions of a semiconductor substrate, used for embedded memory cell applications.

It is another object of this invention to reduce the contact hole aspect ratio for the high performance CMOS devices, and for the storage node plug opening of the CMOS devices in the embedded memory cells, via chemical mechanical polishing procedures, and the use of a silicon oxide removal procedure performed in the embedded memory region.

In accordance with the present invention a process for fabricating high performance CMOS devices on SOI regions in peripheral regions of a semiconductor substrate, and for fabricating CMOS devices for embedded memory cells on recessed portions of the same semiconductor substrate, featuring a reduction in the aspect ratio for contact hole openings and storage plug openings, is described. After formation of field oxide (FOX) regions on portions of a semiconductor substrate to be used for embedded memory cells, a silicon on insulator (SOI) layer is formed on portions of the semiconductor substrate not occupied by the FOX regions, to be used to accommodate the high performance peripheral CMOS devices. After removal of the FOX regions the CMOS devices for embedded memory cell applications is formed on the recessed portion of semiconductor, while higher performing CMOS devices are formed on the SOI region. After deposition of a first insulator layer, and a first planarization procedure, a top portion of the planarized first insulator layer is removed in the embedded memory region. A storage node plug opening and storage node plug structure are formed in the remaining bottom portion of the first insulator layer, with the aspect ratio of the storage node plug opening reduced via previous removal of the top portion of first insulator layer. A second insulator layer is deposited and planarized, resulting in a first composite insulator layer comprised of thin, planarized second insulator layer on first insulator layer, overlying the CMOS devices in the SOI region, and resulting in a second composite insulator layer comprised of a thicker second insulator layer component on a bottom portion of first insulator layer, in the embedded memory region. A capacitor structure is formed in an opening in the thicker second insulator layer of the second composite insulator layer, overlying and contacting the storage node plug structure. A contact hole opening is then formed in the first composite insulator layer exposing a portion of the CMOS source/drain region, in the SOI region, with the aspect ratio of the contact hole opening reduced as a result of the second planarization procedure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating first type CMOS devices on an SOI layer, and fabricating second type CMOS devices on a recessed region of a semiconductor substrate, featuring a reduction of the aspect ratio for contact hole and storage node openings defined in composite insulator layer to expose regions of both type CMOS devices, will now be described in detail. Semiconductor substrate 3, comprised of P type, single crystalline silicon with a <100> crystallographic orientation, is used and schematically shown in FIG.

Figure 1:
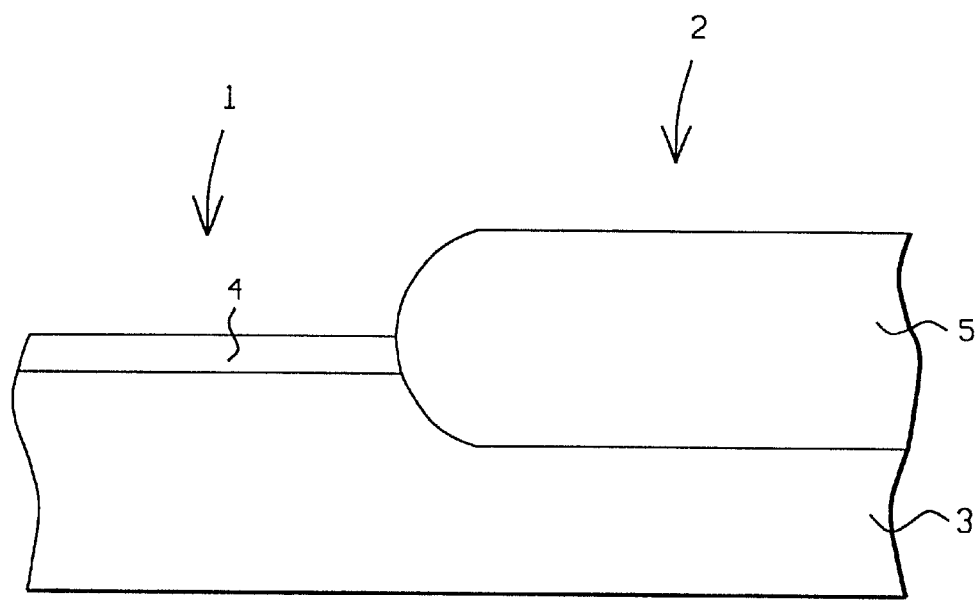
FIGS. 1–12, which schematically, in cross-sectional style, show key stages used to fabricate first type CMOS devices on an SOI layer, and to fabricate second type CMOS devices on a recessed region of a semiconductor substrate, featuring a reduction of the aspect ratio for contact hole and storage node openings made to regions of both type CMOS devices.

1. Region 1, of semiconductor substrate 3, will be used to accommodate the higher performing CMOS devices fabricated on an SOI layer, while region 2, will be used to accommodate the CMOS devices of the embedded memory cell, located on recessed portions of semiconductor substrate 3. Oxidation resistant shape 4, comprised of silicon nitride, or silicon nitride on pad silicon oxide, is defined on the surface of region 1, of semiconductor substrate 3, to allow field oxide (FOX) region 5, to be formed in region 2, of semiconductor substrate 3. The silicon nitride component of oxidation resistant shape 4, is obtained at a thickness between about 50 to 8000 Angstroms, via low pressure chemical vapor deposition (LPCVD), or plasma enhanced vapor deposition (PECVD) procedures, followed by definition via photolithographic and dry etching procedures, using $Cl_2$ or $CF_4$ as an etchant for silicon nitride. A thermal oxidation procedure performed at a temperature between about 600 to 110° C., in an oxygen—steam ambient, is next employed to form FOX region 5, at a thickness between about 200 to 20,000 Angstroms, in embedded memory cell region 2, or in the portions of semiconductor substrate 3, not protected by oxidation resistant shape 4. The growth of FOX region 5, extends between about 100 to 10,000 Angstroms into semiconductor substrate 3. The result of these procedures is schematically shown in FIG. 1.

Figure 2:
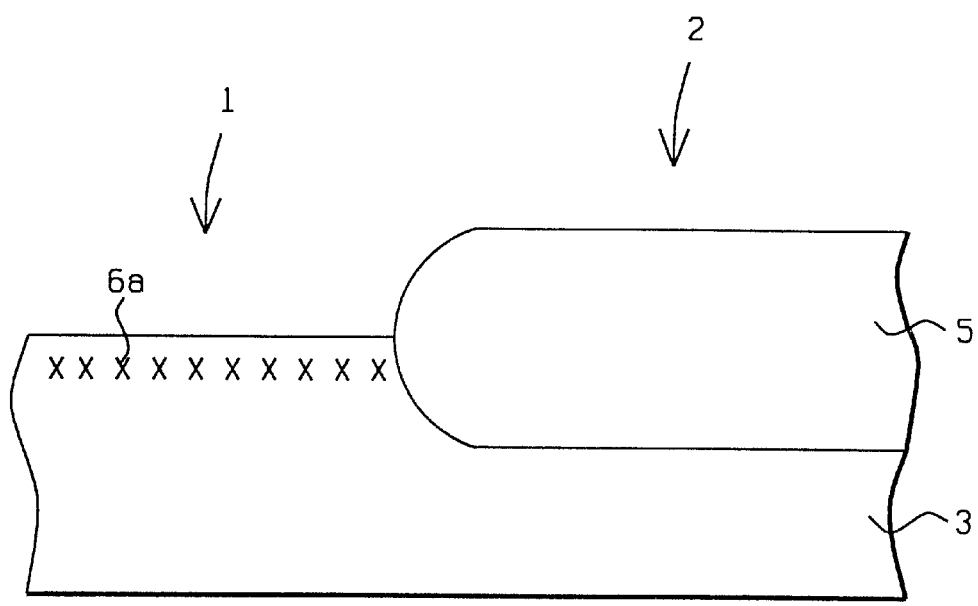
Figure 3:
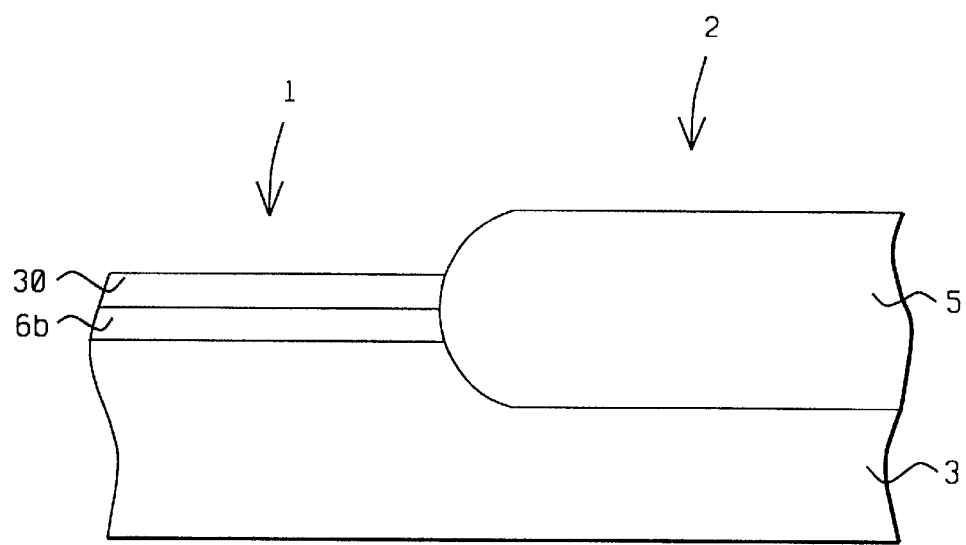

After removal of oxidation resistant shape 4, via selective wet etch procedures using hot phosphoric acid, oxygen ions 6a, are implanted into a portion of semiconductor substrate 3, in region 1, or the region of the semiconductor substrate to be used for the high performance peripheral circuitry. FOX region 5, protected embedded memory cell region 2, from the oxygen implantation procedure, performed at an energy between about 50 to 1000 KeV, at a dose between about 1E14 to 1E16 atoms/$cm^2$. This is schematically shown in FIG. 2. If desired the pad silicon oxide component of the oxidation resistant shape can remain on the surface of region 1, during the high energy implantation procedure. An anneal procedure is next performed at a temperature between about 700 to 1100° C., in an inert ambient, to activate the implanted oxygen ions, forming buried oxide layer 6b, shown schematically in FIG. 3. The depth of buried oxide layer 6b, in region 1, of semiconductor substrate 3, results in a portion of silicon, or a portion of semiconductor substrate 3, now overlying buried oxide region 6b, resulting in a silicon on insulator (SOI) layer 30, in the region to be used for the high performance CMOS devices in the peripheral circuitry. The thickness of SOI layer 30, on underlying buried oxide region 6b, is between about 50 to 6000 Angstroms.

Figure 4:
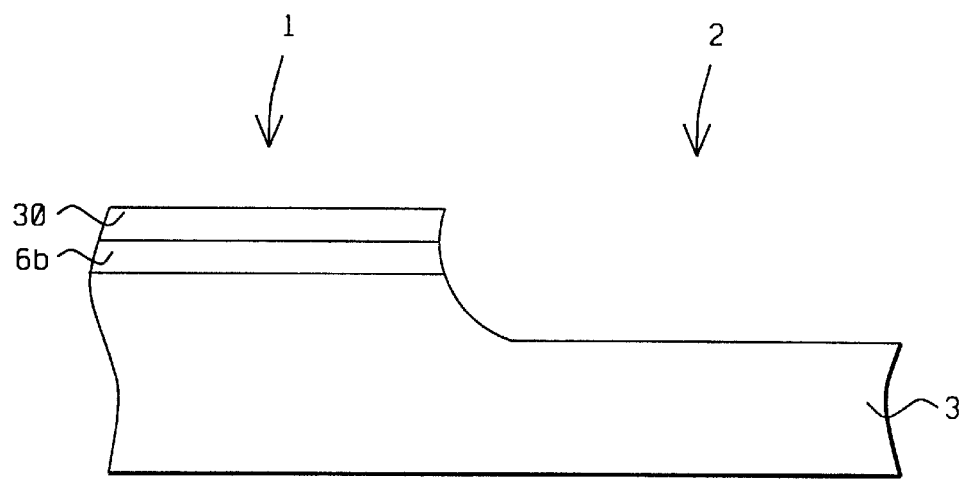

Removal of FOX region 5, and the pad silicon oxide component of oxidation resistant shape 4, if used, is next addressed via use of a buffered hydrofluoric (BHF) solution. The removal of FOX region 5, results in a recess in region 2, of semiconductor substrate 3, to a depth between about 100 to 10,000 Angstroms below the original surface of the semiconductor substrate, with the difference in height between the top surface of SOI layer 30, in region 1, and the bottom surface of the recessed region in embedded memory cell region 2, now between about 50 to 10,000 Angstroms. This is schematically shown in FIG. 4.

Figure 5:
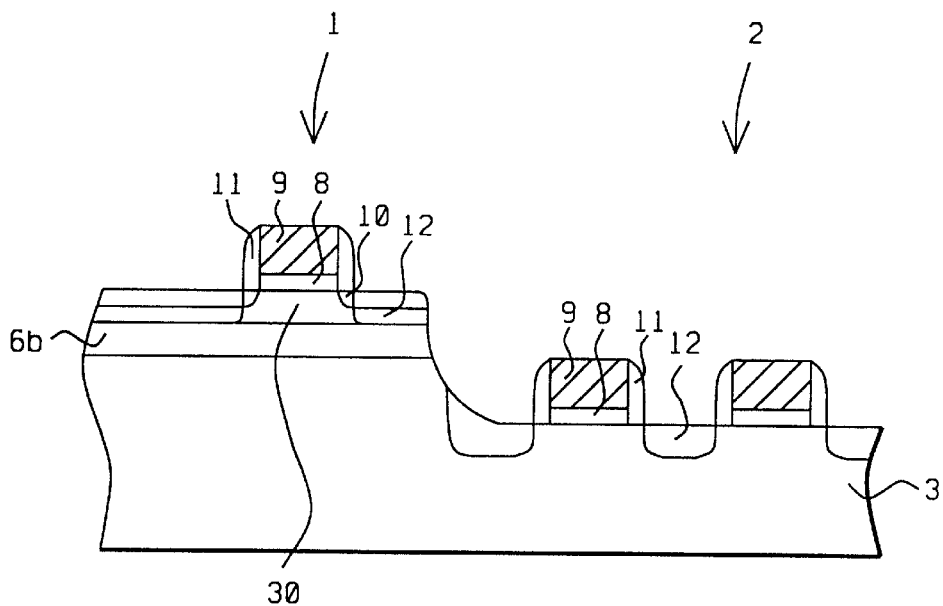

The formation of the high performance CMOS devices in peripheral region 1, and of the CMOS devices used for the embedded memory cell function in region 2, is next addressed and schematically shown in FIG. 5. The increased performance of the CMOS devices in region 1, when compared to counterpart CMOS devices in region 2, is a result of several factors, one being lower junction capacitance resulting from source/drain regions butting an underlying insulator region. In addition the higher performance CMOS devices are formed with shorter channel lengths, obtained via design factors as well as via the use of lightly doped source/drain regions, self-aligned to the gate structures. Briefly, gate insulator 8, comprised of silicon dioxide, is thermally grown to a thickness between about 40 to 200 Angstroms. If desired to further increase CMOS performance in peripheral region 1, the thickness of gate insulator layer 8, can be reduced to a value below the thickness of gate insulator layer for CMOS devices in embedded memory cell region 2. Conductive gate structures 9, comprised of either doped polysilicon or a metal silicide-polysilicon composite layer, are next formed on gate insulator layer 8. This is accomplished via deposition of either an in situ doped polysilicon layer, or a metal silicide-polysilicon layer, via LPCVD procedures, followed by photolithographic and dry etching procedures used for definition of the desired conductive gate structures. Again if desired additional performance for the peripheral CMOS devices can be realized via decreases in gate width dimension, resulting in shorter channel widths. Lightly doped source/drain region 10, is next formed for only the peripheral CMOS devices in region 1, via implantation of arsenic or phosphorous ions into portions of region 1, not covered by conductive gate structures 9. Region 2, used for embedded memory cell applications is protected by a photoresist shape, (not shown in the drawings), during formation of lightly doped source/drain region 10. Insulator spacers 11, at a thickness between about 400 to 2000 Angstroms, comprised of either silicon oxide or silicon nitride, are next formed on the sides of all conductive gate structures 9. This is accomplished via deposition of either silicon oxide or silicon nitride using LPCVD or PECVD procedures, followed by a blanket, anisotropic reactive ion etch (RIE), procedure, using $CHF_3$ or $CF_4$ as an etchant. Heavily doped source/drain regions 12, are next formed in portions of region 1, and in portions of region 2, not covered by conductive gate structures 9, or by insulator spacers 11, via implantation of arsenic or phosphorous ions. An anneal procedure is then employed to activate the implanted ions in lightly doped source/drain region 10, and in heavily doped source/drain regions 12. Although the above examples have been described for N channel, NMOS devices, if desired P channel, or PMOS devices can be used and obtained via formation of N well regions in portions of region 1, and region 2, with the lightly doped source/drain, and heavily doped source/drain region formed using P type implanted ions.

Figure 6:
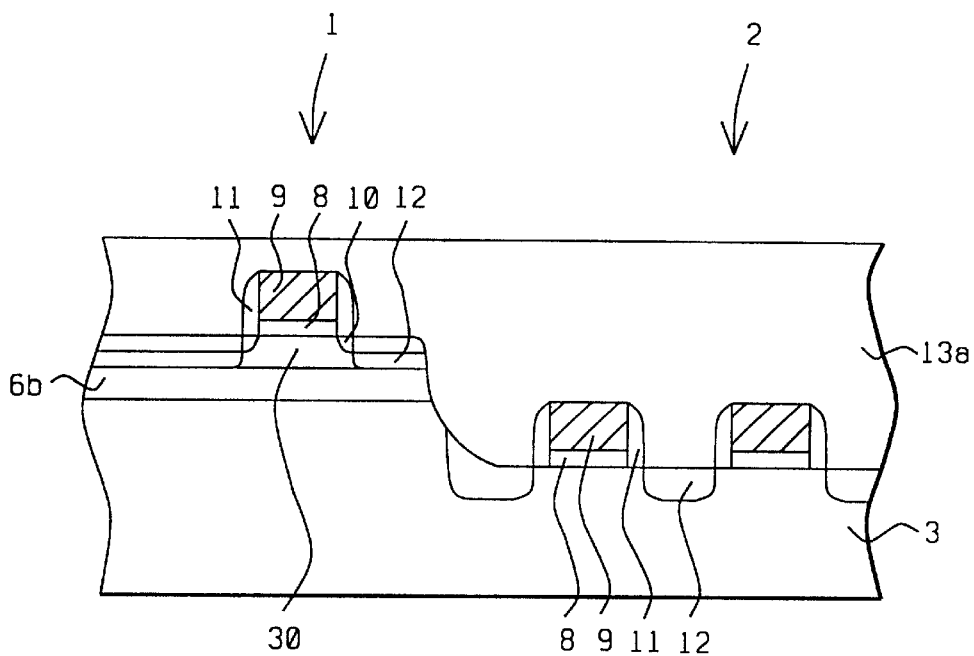
Figure 7:
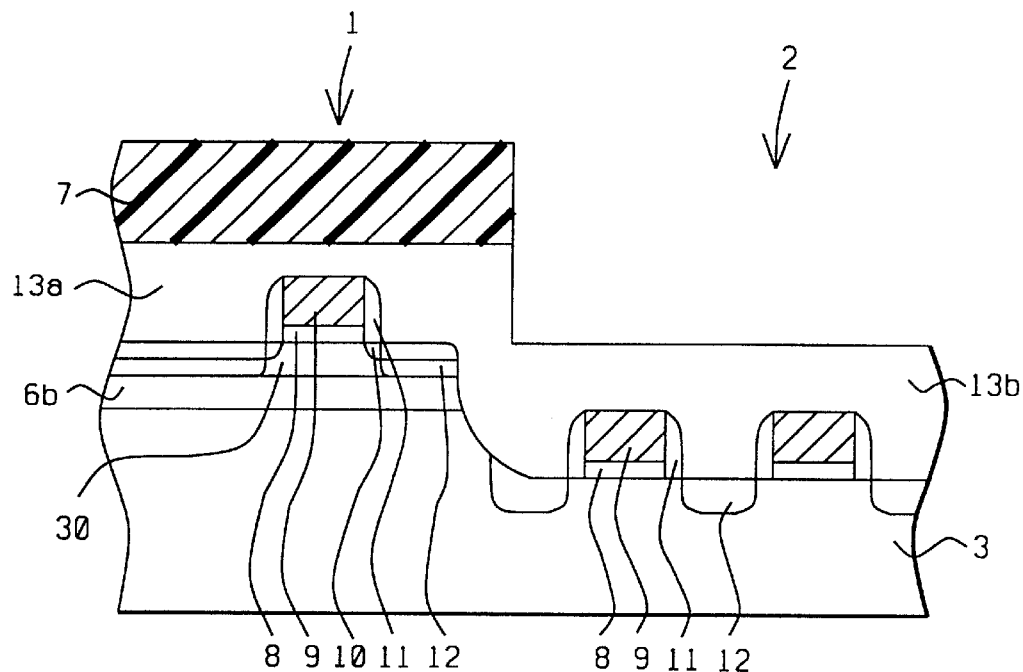

First insulator layer 13a, comprised of silicon oxide, or boro-phosphosilicate glass (BPSG), is next deposited via LPCVD or PECVD procedures, to a thickness between about 100 to 10,000 Angstroms. A chemical mechanical polishing (CMP), procedure is next used for planarization purposes, resulting in a smooth top surface topography for first insulator layer 13a. This is schematically shown in FIG. 6. To reduce the aspect ratio for a subsequent storage node plug opening in embedded memory cell region 2, and for a subsequent contact hole opening in peripheral region 1, removal of a top portion of first insulator layer 13a, located overlying the CMOS devices in embedded memory cell region 2, is next performed. Photoresist shape 7, is used to protect first insulator layer 13a, in peripheral region 1, from an etch procedure used to remove between about 100 to 5000 Angstroms of first insulator layer 13a, resulting in insulator layer 13b, now at a thickness between about 100 to 5000 Angstroms, in embedded memory cell region 2. This is schematically illustrated in FIG. 7. The etch procedure used to remove a top portion of first insulator layer in region 2, can be a wet etch procedure using a BHF solution, or a dry, reactive etching procedure, using $CF_4$ as an etchant can be employed. Photoresist shape 7, is then removed via plasma oxygen ashing procedures.

Figure 8:
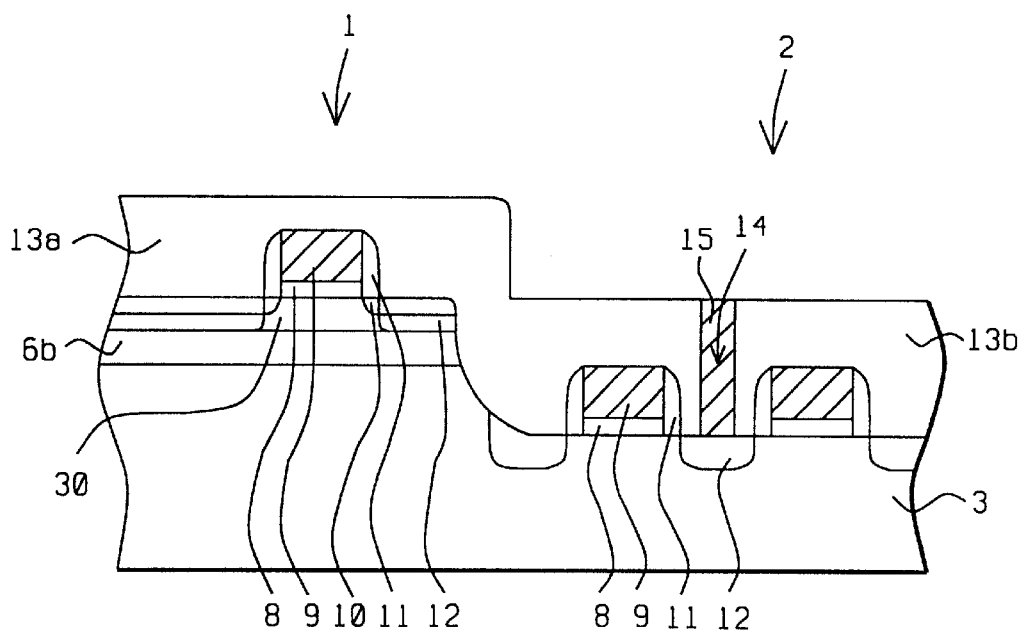

Storage node plug opening 14, is next formed in insulator 13b, via photolithographic and dry etching procedures. The aspect ratio of this opening, comprised with a diameter between about 0.01 to 1.5 um, has been greatly reduced via removal of the top portion of first insulator layer 13a. If thinning of first insulator layer 13a, were not performed the aspect ratio of narrow diameter, storage node opening 14, defined in the thicker, first insulator layer, would be large, possibly presenting processing difficulties. Storage node plug opening 14, is defined in insulator layer 13b, via an anisotropic reactive ion etching procedure using $CF_4$ as a selective insulator etchant, resulting in exposure of a portion of the top surface of heavily doped source/drain region 12. After removal of the photoresist shape used for definition of storage node plug opening 14, via plasma oxygen ashing procedures, a conductive layer such as in situ doped polysilicon, or tungsten, is deposited, via LPCVD procedures to a thickness between about 100 to 5000 Angstroms, completely filling storage node plug opening 14. Removal of portions of the conductive layer, from the top surface of insulator layer 13b, and from the top surface of first insulator layer 13a, is accomplished via selective dry etching procedures, using $Cl_2$ as an etchant, resulting in the formation of storage node plug structure 15, in storage node plug opening 14. This is schematically shown in FIG. 8.

Figure 9:
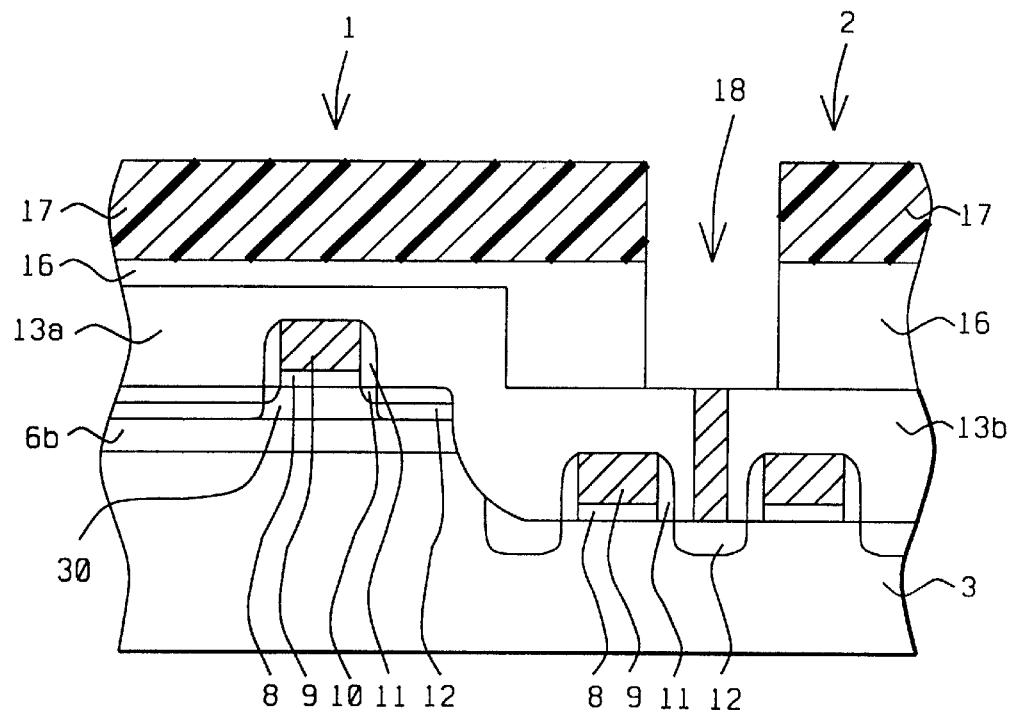

Second insulator layer 16, again comprised of either silicon oxide or BPSG, is next deposited via LPCVD or PECVD procedures, at a thickness between about 1000 to 15,000 Angstroms. Another CMP procedure is now employed for planarization purposes resulting in a smooth top surface topography for second insulator layer 16. The CMP procedure is performed to leave only a thin portion of second insulator layer 16, between about 500 to 5000 Angstroms, remaining on first insulator layer 13a. This will limit the depth of, and the aspect ratio of a subsequent contact hole opening in region 1. The thickness of second insulator layer 16, in embedded memory cell region 2, is between about 100 to 10,000 Angstroms. Definition of capacitor opening 18, in second insulator layer 16, is next addressed and schematically shown in FIG. 9. Photoresist shape 17, is used as a mask to allow an anisotropic reactive ion etching procedure, using $CHF_3$ as an etchant for second insulator layer 16, to define capacitor opening 18, with the top surface of storage node plug structure 15, exposed at the bottom of capacitor opening 18. Photoresist shape 17, is then removed via plasma oxygen ashing procedures.

Figure 10:
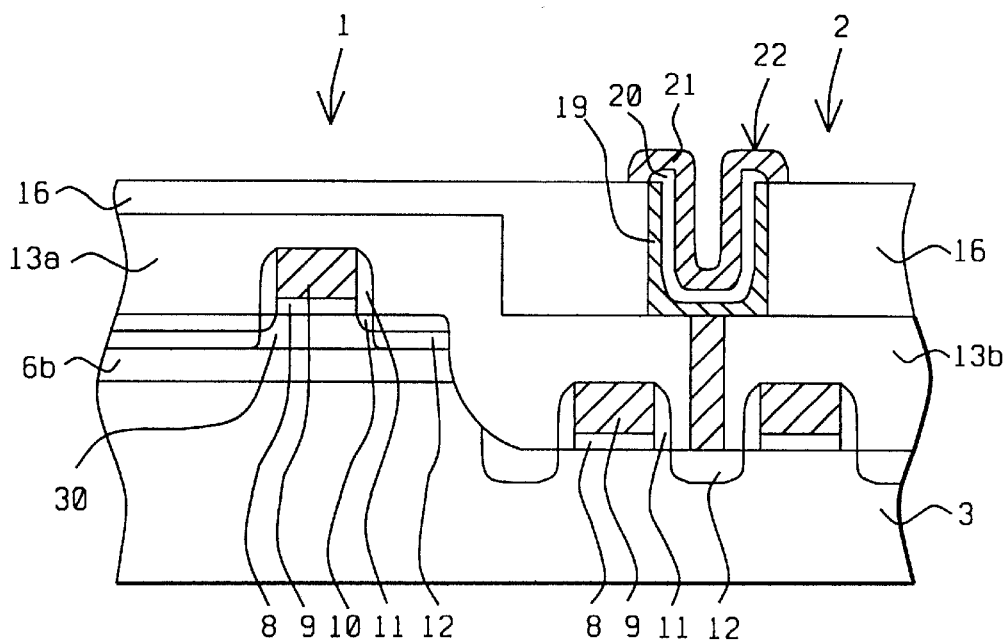

The formation of capacitor structure 22, in capacitor opening 18, is next addressed and illustrated schematically using FIG. 10. A polysilicon layer is first deposited via LPCVD procedures at a thickness between about 20 to 5000 Angstroms, completely filling capacitor opening 18. A CMP procedure is next used to remove portions of the polysilicon layer from the top surface of second insulator layer 16, resulting in lower electrode structure 19, overlying and contacting the top surface if storage node plug structure 15. If desired lower electrode structure 19, can be comprised of a conductive layer with a roughened top surface to increase the surface area of the lower electrode structure, and thus the capacitance of the capacitor structure. Capacitor dielectric layer 20, comprised of oxidized silicon nitride on oxide (ONO), is next formed on the top surface of lower electrode structure 19, at a thickness between about 30 to 200 Angstroms. Finally another conductive layer, such as polysilicon, is deposited via LPCVD procedures at a thickness between about 200 to 5000 Angstroms, followed by photolithographic and dry etch procedures, defining upper electrode structure 21, and resulting in capacitor structure 22, in capacitor opening 18, with capacitor structure 22, comprised of upper electrode structure 21, capacitor dielectric layer 20, and lower electrode structure 19. The photoresist shape used for definition of upper electrode structure 21, is removed via plasma oxygen ashing procedures.

Figure 11:
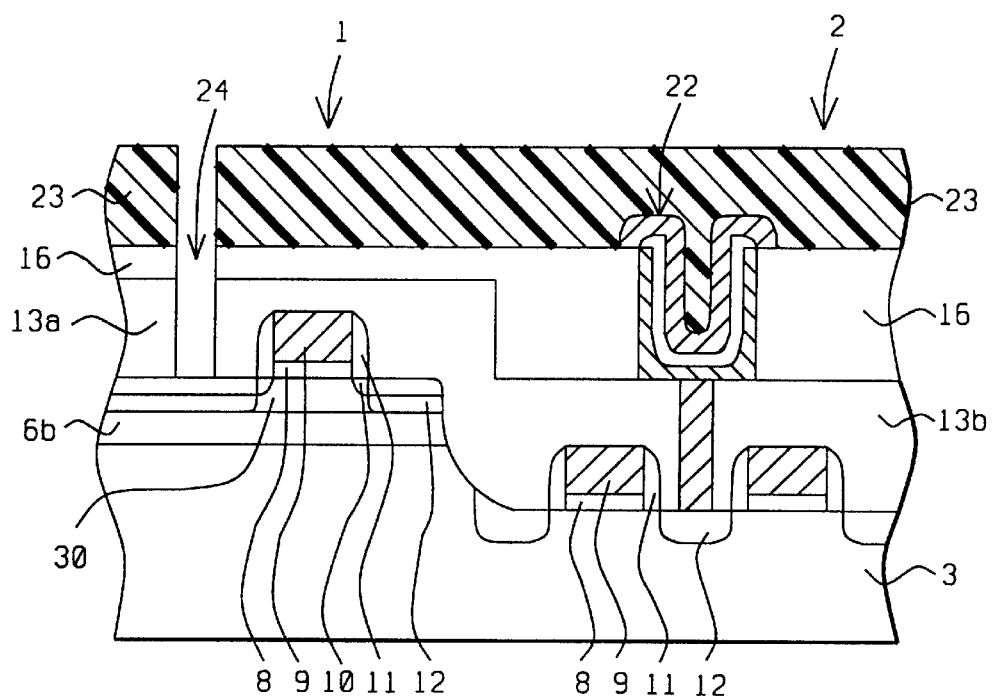

Definition of a contact hole opening to expose a portion of a heavily doped source/drain region, in peripheral region 1, is next addressed and shown schematically in FIG. 11. Prior to forming the contact hole opening a thin silicon oxide layer, (not shown in the drawings), is used to protect capacitor structure 22, from subsequent processing procedures. Photoresist shape 23, is then formed and used as an etch mask to allow definition of contact hole opening 24, in second insulator layer 16, and in first insulator layer 13a, to be performed. This is accomplished via anisotropic reactive ion etching procedures using $CHF_3$ as an etchant for the insulator layers. Contact hole opening 24, is defined with a diameter between about 0.05 to 1.0 um. If second insulator layer 16, were not thinned via the previous CMP procedure, the additional thickness of second insulator layer 16, and the narrow width of contact hole opening 24, would have resulted in a larger than desired aspect ratio for the dry etch procedure. In addition the ability to totally accommodate capacitor opening 18, only in the portion of second insulator layer 16, located in the recessed region of second insulator layer 16, allowed second insulator layer 16, to be thinned in peripheral region 1, thus reducing the aspect ratio for contact hole opening 24. After definition of contact hole opening 24, photoresist shape 23, is removed using plasma oxygen ashing procedures.

Figure 12:
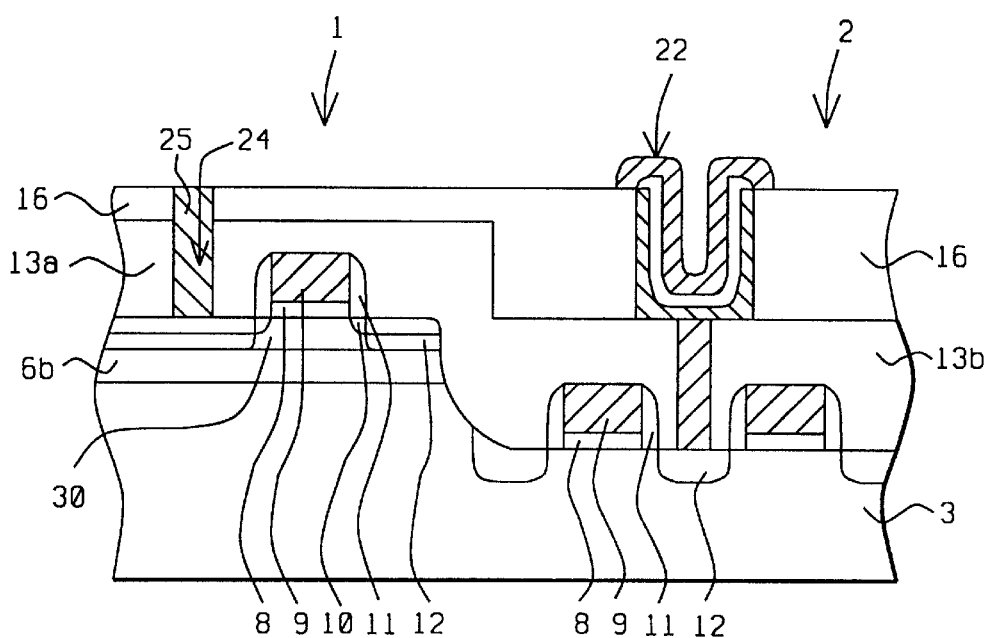

Finally contact plug structure 25, shown schematically in FIG. 12, is formed in contact hole opening 24. A conductive layer such as aluminum, aluminum-copper, tungsten, or doped polysilicon is deposited via plasma vapor deposition, or via LPCVD procedures, at a thickness between about 100 to 8000 Angstroms, completely filling contact hole opening 24. A selective dry etch procedure is then employed to remove portions of the conductive layer from the top surface of second insulator layer 16, and from the top surface of the thin silicon oxide layer located on the top surface of capacitor structure 22, resulting in contact plug structure 25, in contact hole opening 24.

While this invention has been particularly shown and described with reference to, the preferred embodiments thereof, it will be understood by those skilled in the art that various changes in form and details may be made without departing from the spirit and scope of this invention.

What is claimed is:

1. A method of forming openings in insulator layers to expose regions of complimentary metal oxide semiconductor (CMOS) devices, formed on a semiconductor substrate, comprising the steps of;

forming a first group of CMOS devices on a silicon on insulator (SOI) layer, on a first region of said semiconductor substrate;

forming a second group of CMOS devices on a second region of said semiconductor substrate, wherein the top surface of said second region of said semiconductor substrate is recessed below the top surface of said SOI layer;

forming a planarized first insulator layer;

removing a top portion of said planarized first insulator layer in said second region of said semiconductor substrate;

forming a capacitor plug structure in an opening defined in a remaining bottom portion of said planarized first insulator layer;

forming a planarized second insulator layer resulting in a thick portion of said planarized second insulator layer overlying said bottom portion of said planarized first insulator layer in said second region of said semiconductor substrate, and resulting in a thin portion of said planarized second insulator layer overlying said planarized first insulator layer, located in said first region of said semiconductor substrate;

forming a capacitor structure in an opening which in turn is formed in said thick portion of said planarized second insulator layer, overlying and contacting a top surface of said capacitor plug structure; and forming a contact structure in a contact hole opening which in turn is defined in said thin portion of said planarized second insulator layer and in said planarized first insulator layer, with said contact structure overlying a region in said SOI layer.

2. The method of claim 1, wherein said first group of CMOS devices are used as peripheral devices located adjacent to an embedded memory cell.

3. The method of claim 1, wherein said second group of CMOS devices are used as components of embedded memory cells, comprising an embedded dynamic random access memory (E-DRAM), cell, an embedded static random access memory (E-SRAM) cell, or an embedded flash memory cell.

4. The method of claim 1, wherein said top portion of said planarized first insulator layer is removed in said second region of said semiconductor substrate via wet etch procedures, using buffered hydrofluoric acid as an etchant.

5. The method of claim 1, wherein said top portion of said planarized first insulator layer is removed in said second region of said semiconductor substrate via dry etch procedures, comprising a reactive ion etching procedure, performed using $CF_4$ as an etchant.

6. The method of claim 1, wherein said contact hole opening, defined in said thin portion of said planarized second insulator layer and in underlying planarized first insulator layer, is accomplished via reactive ion procedures, using $CHF_3$ as an etchant.

7. A method of forming a storage node opening and a contact hole opening in composite insulator layers, to expose a region of a recessed CMOS device used as a component in a embedded memory cell, and to expose a region of a CMOS device formed on a silicon on insulator (SOI) layer used as a peripheral device for said embedded memory cell, comprising the steps of:

growing a field oxide (FOX) region in a first portion of a semiconductor substrate to be used as an embedded memory cell region;

forming said SOI layer on a second portion of said semiconductor substrate to be used as a peripheral region;

removing said FOX region resulting in said embedded memory cell region recessed below a top surface of said SOI layer located in said peripheral region;

forming a first group of CMOS devices on said SOI layer, and forming a second group of CMOS devices on recessed, said embedded memory cell region;

depositing a first insulator layer;

performing a first chemical mechanical polishing (CMP) procedure resulting in a planarized first insulator layer;

removing a top portion of said planarized first insulator layer in said embedded memory cell region, resulting in a remaining bottom portion of said planarized first insulator layer;

forming said storage node opening in said bottom portion of said planarized first insulator layer, exposing an active device region of said second group of CMOS devices;

forming a storage node plug structure in said storage node opening;

depositing a second insulator layer;

performing a second CMP procedure resulting in a first composite insulator layer in said peripheral region comprised of a thinned, planarized second insulator layer on said planarized first insulator layer, and resulting in a second composite insulator layer in said embedded memory cell region comprised of said planarized second insulator layer on said bottom portion of said planarized first insulator layer;

forming a capacitor opening in said planarized second insulator layer in said embedded memory cell region, exposing top a surface of said storage node plug structure;

forming a capacitor structure in said capacitor opening;

forming said contact hole opening in said first composite insulator layer exposing an active device region of said first group of CMOS devices; and forming a contact structure in said contact hole opening.

8. The method of claim 7, wherein said embedded memory cell can be an embedded dynamic random access memory (E-DRAM), cell, an embedded static random access memory (E-SRAM) cell, or an embedded flash memory cell.

9. The method of claim 7, wherein recessing of said embedded memory cell region is accomplished via selective wet etch removal of a field oxide region using a buffered hydrofluoric acid solution.

10. The method of claim 7, wherein said top portion of said planarized first insulator layer is removed in said embedded memory cell region via wet etch procedures using buffered hydrofluoric acid as an etchant.

11. The method of claim 7, wherein said top portion of said planarized first insulator layer is removed in said embedded memory cell region via dry etch procedures, comprising a reactive ion etching procedure, using $CF_4$ as an etchant.

12. The method of claim 7, wherein said contact hole opening defined in said first composite insulator layer, is accomplished via reactive ion procedures, using $CHF_3$ as an etchant.

* * * * *